United States Patent
Boden

(10) Patent No.: US 6,965,130 B2
(45) Date of Patent: Nov. 15, 2005

(54) ALTERNATING IMPLANT RING TERMINATIONS

(75) Inventor: Milton J. Boden, Redondo Beach, CA (US)

(73) Assignee: International Rectifier Corporation, El Segundo, CA (US)

( * ) Notice: Subject to any disclaimer, the term of this patent is extended or adjusted under 35 U.S.C. 154(b) by 97 days.

(21) Appl. No.: 10/456,638

(22) Filed: Jun. 5, 2003

(65) Prior Publication Data
US 2003/0227028 A1 Dec. 11, 2003

Related U.S. Application Data
(60) Provisional application No. 60/387,122, filed on Jun. 7, 2002.

(51) Int. Cl.[7] ............................................... H01L 29/74
(52) U.S. Cl. ........................ 257/127; 257/108; 257/110; 257/117; 257/120
(58) Field of Search .................................. 257/110, 120, 257/127

(56) References Cited

U.S. PATENT DOCUMENTS
6,525,389 B1 * 2/2003 Ahmed ........................ 257/486
6,642,551 B2 * 11/2003 Zommer ....................... 257/127

* cited by examiner

*Primary Examiner*—Long Pham
*Assistant Examiner*—Wai-Sing Louie
(74) *Attorney, Agent, or Firm*—Ostrolenk, Faber, Gerb & Soffen, LLP

(57) ABSTRACT

A semiconductor device including a semiconductive body having formed therein an active region and a termination feature which includes spaced field rings disposed around the active region and diffusion rings of the same conductivity type as, but different conductivity than the semiconductive body formed between each pair of field rings.

13 Claims, 2 Drawing Sheets

ALTERNATING IMPLANT RING TERMINATIONS

RELATED APPLICATIONS

The present application is based on and claims the benefit of U.S. Provisional Application Ser. No. 60/387,122, filed on Jun. 7, 2002, entitled ALTERNATING IMPLANT RING TERMINATIONS, the entire contents of which are expressly incorporated herein by reference.

FIELD OF THE INVENTION

The present invention relates to power semiconductor devices, and more particularly to a termination feature for a power semiconductor device.

BACKGROUND OF THE INVENTION

All power semiconductor devices include an active region in which the active elements of the device are found. The active region of a typical power semiconductor device includes a diffusion of one conductivity type formed in a semiconductive body of an opposite conductivity type thereby forming a PN junction. A power semiconductor device is more susceptible to breakdown at the periphery of the PN junction of the active region where there is crowding by the electric field lines (i.e. where the radius of curvature of the diffusion that forms the PN junction is low). Thus, in high voltage semiconductor power devices, a termination feature is included to spread the high electric fields at the periphery of the PN junction of the active area to reduce the strength of the electric field in order to improve the ability of the device to withstand breakdown.

A well known termination feature used in power semiconductor devices is a field ring surrounding the active region. A field ring is a diffusion of a conductivity type opposite to that of the conductivity type of the semiconductive body in which it is formed. To effectively reduce the field strength around the edge of the PN junction in the active region the distance between the field ring and the edge of the active region may be selected to obtain a desired potential drop between the PN junction of the active region and the field ring. Typically, by reducing the distance between the active region and the field ring, the field strength around the edge of the active region may be reduced. However, it should be noted that the selected distance must be such that it does not cause the field strength to become too high at the edge of the field ring itself. Thus, the distance between the field ring and the junction in the active region is a factor that increases the size of the device.

It is also well known to use a plurality of spaced field rings to spread the electric field. However, the spacing between the field rings disadvantageously consumes a large area around the active region of the semiconductor device thereby increasing the size of the device.

SUMMARY OF THE INVENTION

In a device according to the present invention, the termination feature includes a plurality of spaced field rings each spaced from another field ring by a diffusion ring of an opposite conductivity type and different conductivity (i.e. resistivity) than the semiconductive body in which the field rings are formed. The variation in the conductivity of the diffusion rings allows for the control of the potential drop from one field ring to the next. The field rings, therefore, can be spaced much closer to one another. As a result, the area occupied by the termination feature can be reduced.

According to another aspect of the present invention a diffusion ring of the opposite conductivity type to that of the field rings and different conductivity than the semiconductive body in which the field rings are formed may be disposed between the termination feature and the PN junction of the active area in order to reduce the distance between the two.

According to an embodiment of the present invention, a thick dielectric layer (e.g., a layer of field oxide) is disposed over the termination feature of the device as is well known. Since the diffusion rings permit the field rings to be spaced closer to one another, the dipole moment between consecutive field rings is reduced, thereby advantageously reducing the electric field strength at the surface of the thick dielectric layer. As a result the stability of the termination feature is improved particularly when die coats and/or mold compounds are applied to the termination feature during assembly.

DETAILED DESCRIPTION OF THE FIGURES

Figure 1:
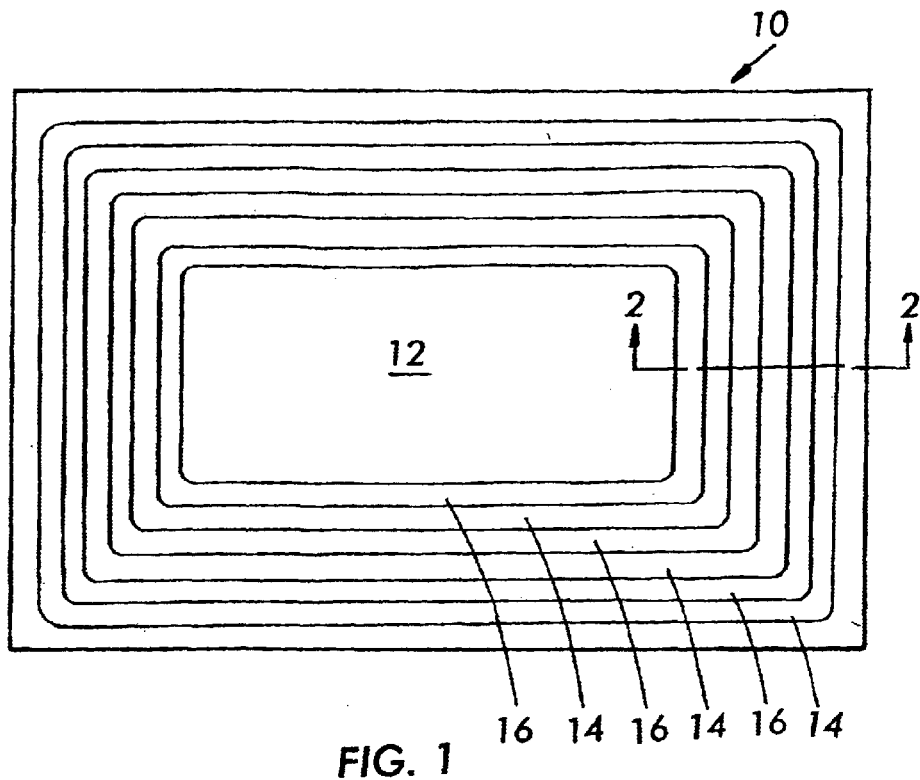
FIG. 1 is a top view of a semiconductor device according to the present invention.
Figure 2:
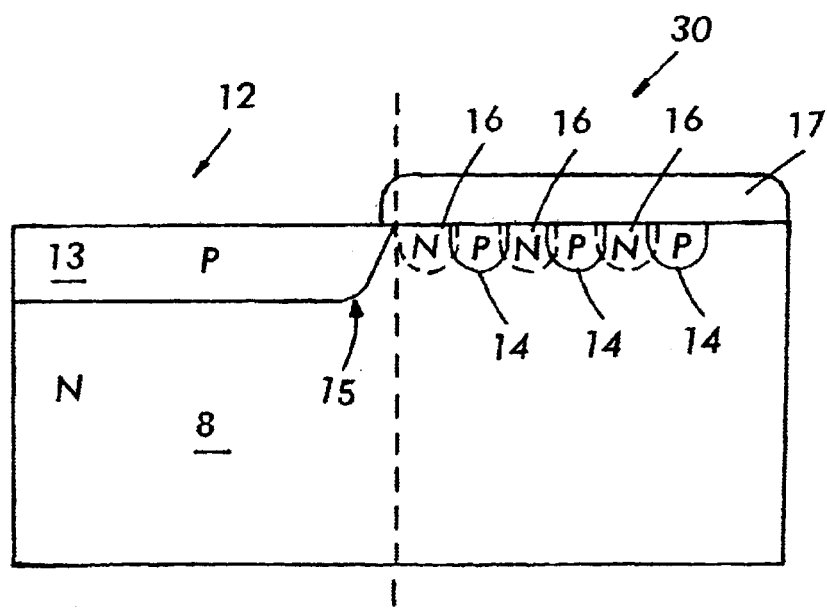
FIG. 2 is a cross-sectional view of the device of FIG. 1 along line 2—2 viewed in the direction of the arrows illustrating a termination feature according to the first embodiment of the present invention.

Referring to FIGS. 1 and 2, semiconductor device 10 according to the first embodiment of the present invention includes an active region 12 and a termination feature 30 both formed in semiconductive body 8. Semiconductive body 8 may be, for example, an epitaxial layer formed over a substrate as is well known in the art.

Active region 12 in device 10 includes a PN junction which is formed by a P type diffusion 13 in an N type semiconductive body 8. It should be noted that active region 12 of a power device should not be understood to only include a PN junction. In some power devices such as, for example, power MOSFETs active region 12 may include other features such as source regions and the like which are not shown.

The PN junction in active region 12 of a power device is susceptible to breakdown at its periphery, particularly at region 15, due to the crowding of the field lines. Accordingly, termination feature 30 includes a plurality of field rings 14 arranged around the periphery of active region 12 to spread the field lines particularly around region 15 in order to improve the ability of the device to withstand breakdown. As is well known in the art field rings 14 are diffusions of opposite conductivity type to that of conductive body 8. For example, in the embodiment shown by FIG. 2 field rings 14 are P type diffusions.

According to an aspect of the present invention, termination feature 30 of device 10 includes diffusion rings 16 disposed between field rings 14 each of a conductivity type opposite to the conductivity type of field rings 14 but different conductivity (i.e. resistivity) than semiconductive body 8 in which they are formed. For example, diffusion rings 16 may be doped with N type dopants at a higher concentration than semiconductive body 8 in order to have a reduced resistivity.

According to the present invention, diffusion rings 16 are provided to control the potential between field rings 14 so that field rings 14 may be spaced closer to one another. As a result the area occupied by termination feature 30 is reduced.

According to another aspect of the invention a diffusion ring 16' may also be arranged between active region 12 and termination feature 30 to reduce the distance between the two, thereby further reducing the area that may be occupied by termination feature 30.

Device 10 also includes a thick layer of field oxide 17 formed over termination feature 30. Since field rings 14 are spaced closer to one another, the dipole moment between consecutive field rings 14 is reduced, thereby advantageously reducing the electric field strength at the surface of the thick layer of field oxide 17. As a result, the stability of termination feature 30 is improved particularly when die coats and/or mold compounds are applied to the termination feature during assembly.

Diffusion rings 16 may be formed during the formation of active region 12 or by an independent masking step. When an independent masking step is used, the width of the opening in the mask may be varied to control an amount of dopants infused into diffusion rings 16. For example, narrow openings may be used to reduce the dopant concentration in diffusion rings 16 as compared to other regions in device 10. Furthermore, the width of the opening in the mask may be selected so that diffusion rings 16 overlap with adjacent field rings, as shown in FIG. 2.

Figure 3:
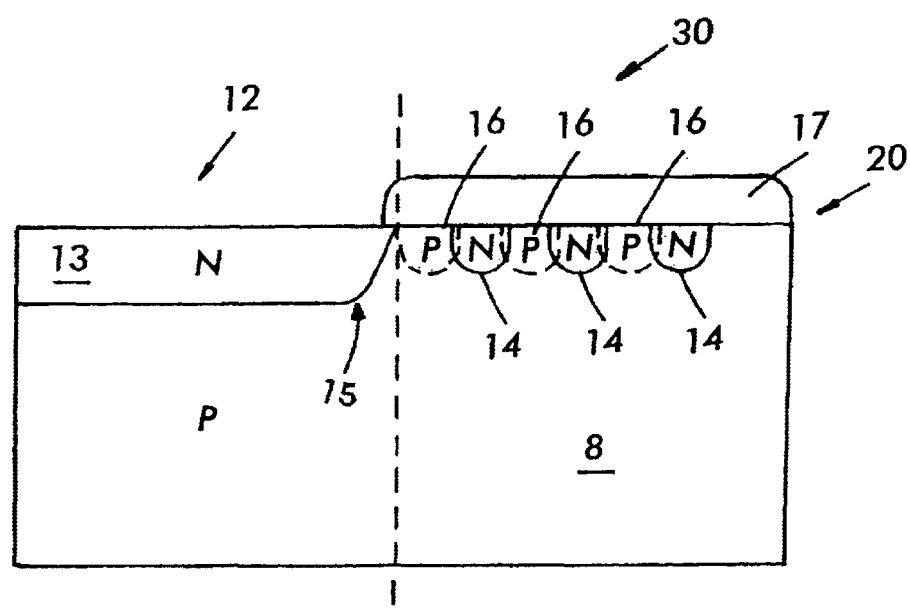
FIG. 3 shows a cross-sectional view of a termination feature according to a second embodiment of the present invention.

It should be appreciated that, although FIGS. 1 and 2 are described with respect to an N type semiconductive body 8 the present invention may be practiced with a P type semiconductive body 8, as shown in FIG. 3. Specifically, a semiconductor device 20 according to the second embodiment of the present invention includes the same regions as those of the first embodiment, except that the conductivity type of each region is opposite to that of the corresponding region of semiconductor device 10 according to the first embodiment of the present invention.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A semiconductor device, comprising:
   a semiconductive body of a first conductivity type;
   an active region formed in said semiconductive body, said active region including a diffused region of a second conductivity type; and
   a termination feature formed in said semiconductive body, said termination feature including a plurality of spaced field rings of said second conductivity type arranged around the periphery of said active region and a plurality of diffusion rings of said first conductivity type disposed between said field rings;
   wherein each of said diffusion rings has a resistivity different from that of said semiconductive body to control a potential drop between the adjacent field rings, thereby permitting the field rings to be spaced closer to one another.

2. A semiconductor device according to claim 1, wherein said semiconductive body has an N type conductivity.

3. A semiconductor device according to claim 1, wherein the diffusion rings are less resistive than said semiconductive body.

4. A semiconductor device according to claim 1, wherein said semiconductive body has P type conductivity.

5. A semiconductor device according to claim 1, further comprising a dielectric layer arranged over said termination feature.

6. A semiconductor device according to claim 1, further comprising a diffusion region of a same conductivity type as said semiconductive body disposed between said termination feature and said active region, said diffusion region being less resistive than said semiconductive body.

7. A semiconductor device comprising:
   an active region receiving semiconductor body of a first conductivity;
   a termination feature formed in said semiconductor body, said termination feature including a plurality of spaced field rings of said second conductivity arranged around the periphery of said active region and a plurality of diffusion rings of said first conductivity type disposed between said field rings;
   wherein each of said diffusion rings has a resistivity different from that of said semiconductive body to control a potential drop between the adjacent field rings, thereby permitting the field rings to be spaced closer to one another.

8. A semiconductor device according to claim 7, wherein said semiconductive body has an N type conductivity.

9. A semiconductor device according to claim 7, wherein the diffusion rings are less resistive than said semiconductive body.

10. A semiconductor device according to claim 7, wherein said semiconductive body has P type conductivity.

11. A semiconductor device according to claim 7, further comprising a dielectric layer arranged over said termination feature.

12. A semiconductor device according to claim 7, further comprising an active region which comprises a diffusion of said second conductivity formed in said semiconductive body.

13. A semiconductor device according to claim 12, further comprising a diffusion region of a same conductivity type as said semiconductive body disposed between said termination feature and said active region, said diffusion region being less resistive than said semiconductive body.

* * * * *

UNITED STATES PATENT AND TRADEMARK OFFICE
CERTIFICATE OF CORRECTION

PATENT NO. : 6,965,130 B2
DATED : November 15, 20005
INVENTOR(S) : Milton J. Boden, Jr.

It is certified that error appears in the above-identified patent and that said Letters Patent is hereby corrected as shown below:

Title page,
Item [75], Inventor, should read:
-- Milton J. Boden, Jr., Redondo Beach, CA (US) --.

Signed and Sealed this

Fourteenth Day of February, 2006

JON W. DUDAS
*Director of the United States Patent and Trademark Office*